(12) United States Patent
Kim et al.

(10) Patent No.: US 7,563,673 B2
(45) Date of Patent: Jul. 21, 2009

(54) METHOD OF FORMING GATE STRUCTURE OF SEMICONDUCTOR DEVICE

(75) Inventors: Young Bog Kim, Icheon-shi (KR); Jun Soo Chang, Icheon-shi (KR); Min Yong Lee, Seoul (KR); Yong Seok Eun, Seongnam-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 314 days.

(21) Appl. No.: 11/268,846

(22) Filed: Nov. 8, 2005

(65) Prior Publication Data

US 2006/0151839 A1    Jul. 13, 2006

(30) Foreign Application Priority Data

Jan. 7, 2005    (KR) .................. 10-2005-0001695

(51) Int. Cl.
  *H01L 21/336*    (2006.01)
(52) U.S. Cl. .............. 438/257; 438/265; 438/267; 438/270; 257/E21.409
(58) Field of Classification Search .............. 438/257, 438/265–267, 270
See application file for complete search history.

(56) References Cited

U.S. PATENT DOCUMENTS

| 5,733,812 A | 3/1998 | Ueda et al. .................. 438/289 |
| 6,770,934 B1 * | 8/2004 | Hung et al. .................. 257/331 |
| 6,839,260 B2 | 1/2005 | Ishii ............................. 365/51 |
| 7,037,787 B2 * | 5/2006 | Fan et al. ..................... 438/267 |

FOREIGN PATENT DOCUMENTS

| JP | 08-032063 | 2/1996 |
| KR | 10-1999-0053212 | 7/1999 |
| KR | 10-2006-0004469 | 1/2006 |

* cited by examiner

*Primary Examiner*—Thanh Nguyen
(74) *Attorney, Agent, or Firm*—Marshall, Gerstein & Borun LLP

(57) ABSTRACT

Disclosed herein is a method for forming a gate structure of a semiconductor device. The method comprises forming a plurality of gates including a first gate dielectric film, a first gate conductive film, and a gate silicide film sequentially stacked on a silicon substrate having a field oxide film, forming a thermal oxide film on a side of the first gate conductive film, etching the silicon substrate exposed between the plurality of gates to a predetermined depth to form a plurality of trenches, forming a second gate oxide film on the interior wall of the trenches, and forming a second gate conductive film in a spacer shape on a predetermined region of the second gate oxide film, and on a side of the first gate conductive film, the gate silicide film, and the thermal oxide film.

8 Claims, 5 Drawing Sheets

METHOD OF FORMING GATE STRUCTURE OF SEMICONDUCTOR DEVICE

BACKGROUND OF THE INVENTION

1. Field of the Invention

The present invention generally relates to a gate structure of a semiconductor device, and a method for forming the same. More particularly, the present invention relates to a method for forming a gate structure of a semiconductor device, which can enhance the refresh property via a process of manufacturing an ultra high integration memory such as 256 megabyte or higher DRAM.

2. Description of the Related Art

Generally, a decrease of the pattern pitch of a transistor for high integration of semiconductors results in a decrease in the threshold voltage of the transistor together with deterioration of a short channel margin. Thus, in order to maintain the threshold voltage $V_t$ for operation of the transistor, ion implantation amount is increased for adjustment of the threshold voltage, thereby increasing the resistance.

In other words, reduction in the size of an identical gate structure for high integration semiconductor devices requires an increase of the ion implantation amount for adjustment of the threshold voltage.

However, the increase of ion implantation amount causes reduction in depth and width of a depletion region at a junction between a source and a drain. A leakage current is increased at the junction, thereby deteriorating the refresh property of the device.

In addition, a planar gate structure with a planar active region has a problem in that the refresh property is further deteriorated upon high integration.

SUMMARY OF THE INVENTION

The present invention has been made to solve the above problems, and it is an object of the present invention to provide a method for forming a gate in a semiconductor device, which can increase the length of a channel without reducing the critical voltage through improvement in structure of the gate, thereby enhancing refresh property.

In accordance with an aspect of the present invention, the above and other objects can be accomplished by the provision of a gate structure of a semiconductor device, comprising: a silicon substrate having a field oxide film; a plurality of gates formed by sequentially stacking a first gate dielectric film, a first gate conductive film, and a gate silicide film on the silicon substrate; a thermal oxide film formed on a side of the first gate conductive film; a plurality of trenches formed between the gates; a second gate oxide film formed on an interior wall of each trench; and a second conductive film formed in a spacer shape on a predetermined region of the second gate oxide film, and on a side of the first gate conductive film, the gate silicide film and the thermal oxide film.

In accordance with another aspect of the present invention, a gate structure of a semiconductor device comprises: a silicon substrate having a field oxide film; a plurality of trenches formed by etching the silicon substrate to a predetermined depth using a photosensitive film pattern formed on the silicon substrate as a mask; and a plurality of gates formed by sequentially stacking a gate insulation film, a gate conductive film, and a gate silicide film on a predetermined region of the trench and a region of the silicon substrate where the photosensitive film pattern are removed.

In accordance with another aspect of the invention, a method for forming a gate structure of a semiconductor device is provided, comprising: forming a plurality of gates including a first gate dielectric film, a first gate conductive film, and a gate silicide film sequentially stacked on a silicon substrate having a field oxide film; forming a thermal oxide film on a side of the first gate conductive film; etching the silicon substrate exposed between the plurality of gates to a predetermined depth to form a plurality of trenches; forming a second gate oxide film on an interior wall of the trenches; and forming a second gate conductive film in a spacer shape on a predetermined region of the second gate oxide film, and on a side of the first gate conductive film, the gate silicide film and the thermal oxide film.

The thermal oxide film may have a thickness of 20~200 Å, and the trenches may have a depth of 200~2,000 Å.

The gate oxide film may have a thickness of 30~300 Å, and the second gate conductive film may be formed to an upper end of the gate silicide film.

The second gate conductive film may have a thickness of 200~2,000 Å, and the spacer nitride film may have a depth of 50~500 Å.

The method may further comprise: forming a spacer nitride film on the side of each gate where the second gate conductive film is formed; forming a source and a drain by implanting ions to a region of the silicon substrate formed with the spacer nitride film and exposed between the gates; and forming a plug by burying an electrode material on the silicon substrate where the source and the drain are formed.

In accordance with yet another aspect of the invention, a method for forming a gate structure of a semiconductor device is provided, comprising: forming a photosensitive film pattern on a silicon substrate having a field oxide film; etching the silicon substrate to a predetermined depth using the photosensitive film pattern as an etching mask to form a trench; and forming a gate including a gate insulation film, a gate conductive film and a gate silicide film sequentially deposited on a predetermined region of the trench and a region of the silicon substrate where the photosensitive film pattern is removed.

BRIEF DESCRIPTION OF THE DRAWINGS

The foregoing and other objects and features of the present invention will be more clearly understood from the following detailed description taken in conjunction with the accompanying drawings, in which.

DESCRIPTION OF THE PREFERRED EMBODIMENTS

Figure 1A:
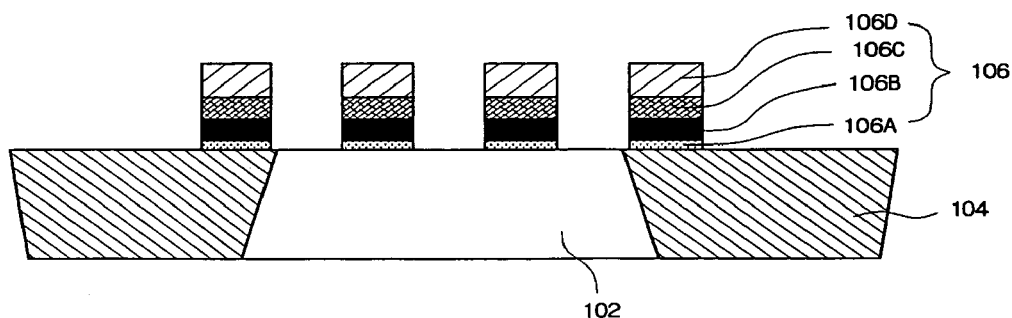
FIGS. 1a to 1i are flow diagrams illustrating a method for forming a gate structure of a semiconductor device in accordance with one embodiment of the present invention.

Preferred embodiments of the present invention will be described in detail with reference to the accompanying drawings.

It should be noted that various modifications and alteration can be made to the embodiments of the present invention, and thus the scope of the present invention is not limited to the embodiments described below. Like components are denoted by the same reference numerals throughout.

FIGS. 1a to 1i are flow diagrams illustrating a method for forming a gate structure of a semiconductor device in accordance with one embodiment of the present invention.

First, as shown in FIG. 1a, a field oxide film 104 is formed on a silicon substrate 102 to define an active region. Then, a plurality of gates 106 are formed on the silicon substrate 102 by sequentially stacking a first gate oxide film 106A, a first gate conductive film 106B, a gate tungsten silicide film 106C, and a gate hard mask 106D.

Preferably, the field oxide film 104 has a thickness of 500~5,000 Å, and the first gate oxide film 106A has a thickness of 30~300 Å. The first gate conductive film 106B is formed of a poly-silicon, and preferably has a thickness of 300~2,000 Å. Preferably, the gate tungsten silicide film 106C has a thickness of 200~2,000 Å, and the gate hard mask 106D has a thickness of 300~3,000 Å.

Figure 1B:
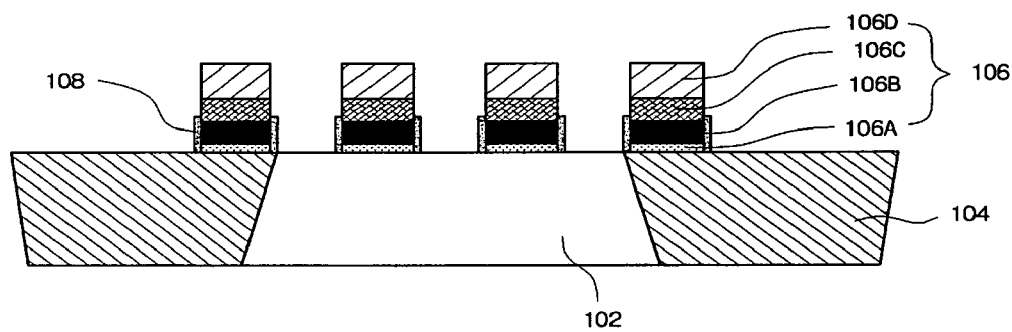

Then, as shown in FIG. 1b, a selective thermal oxide film 108 is formed on a side of each gate 106. It is necessary to form the selective thermal oxide film 108 on an entire exposed side surface of the first gate conductive film 106B so as to insulate the first gate conductive film 106B in the gate 106 from the surroundings. At this time, the thermal oxide film 108 preferably has a thickness of 20~200 Å.

Figure 1C:
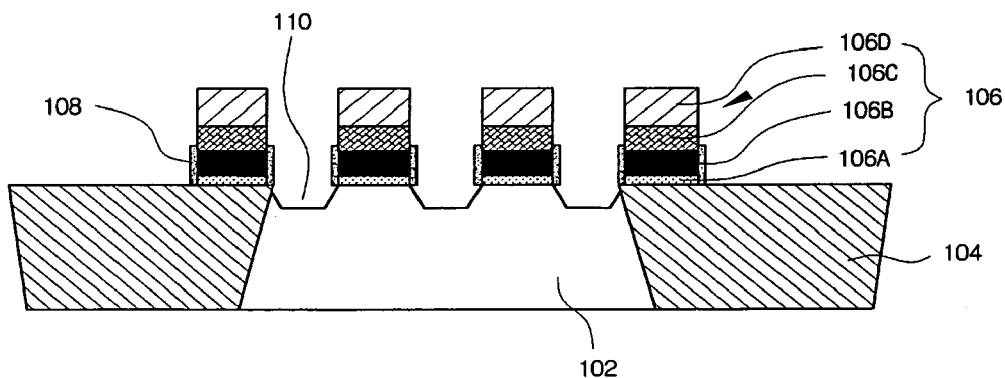

Then, as shown in FIG. 1c, a plurality of trenches 110 are formed by removing an exposed region of the silicon substrate 102 through dry etching. Here, each trench 110 is formed between the gates 106, and preferably has a depth of 20~200 Å from the surface of the exposed silicon substrate.

Figure 1D:
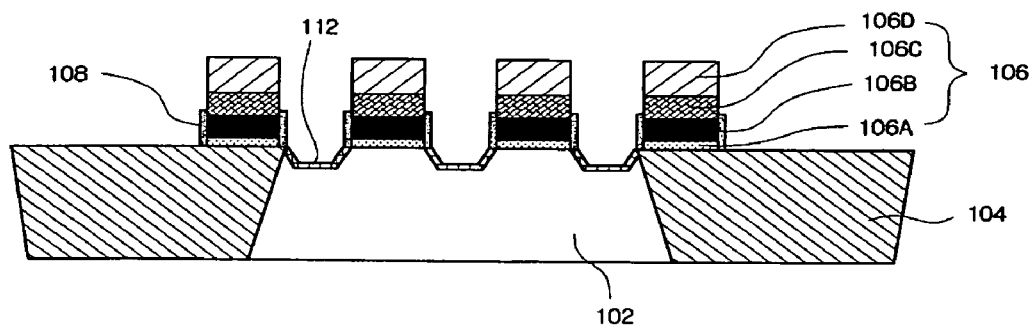

Next, as shown in FIG. 1d, the surface of the silicon substrate 102 exposed through the trenches 110 is oxidized by selective thermal oxidation to form a second gate oxide film 112. At this time, the second gate oxide film 112 has a thickness of about 30~300 Å.

Figure 1E:
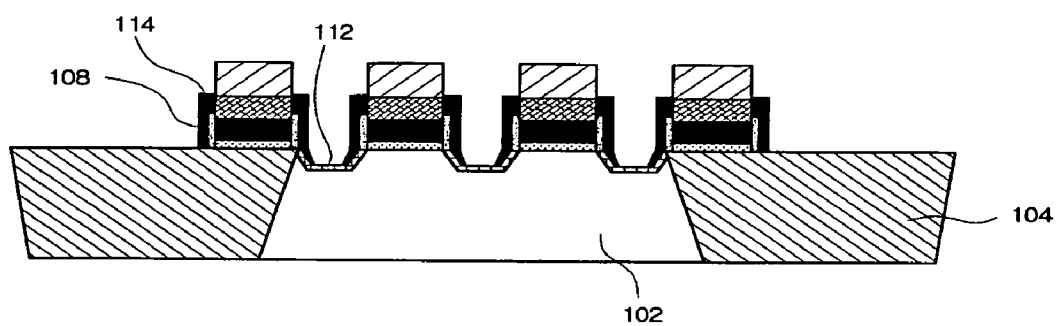

Then, as shown in FIG. 1e, a poly-silicon is deposited to a predetermined thickness on the resultant, and is then removed by dry etching to form a second gate conductive film 114 of a spacer shape on a side of the oxide film. At this time, it is preferable that the deposited poly-silicon have a thickness of about 200~2,000 Å, and that the second gate conductive film 114 be formed to an upper end of the tungsten silicide through dry etching.

Figure 1F:
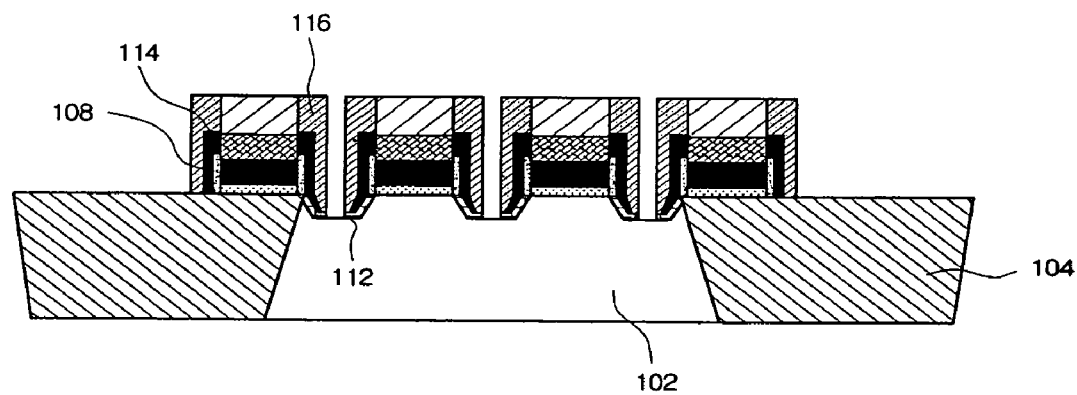

Then, as shown in FIG. 1f, a nitride film is deposited over an entire surface of the resultant, and is then removed by dry etching to form a spacer nitride film 116 on a side of each gate where the second gate conductive film 114 is formed. At this time, the spacer nitride film 116 preferably has a thickness of 50~500 Å.

Figure 1G:
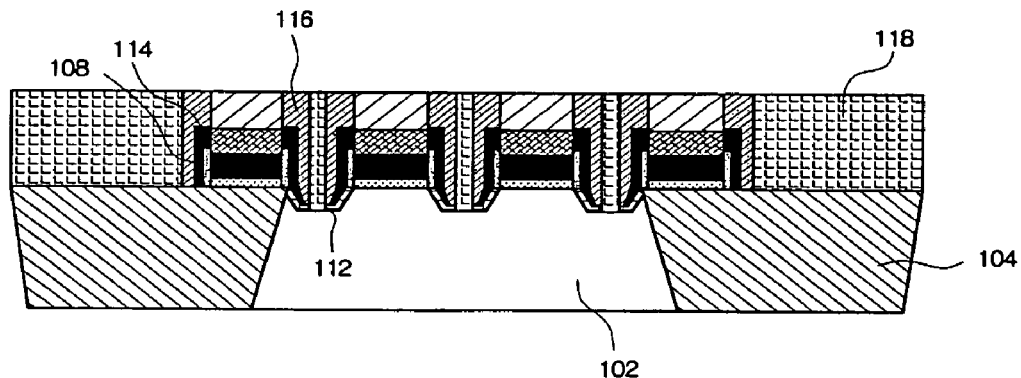

Next, as shown in FIG. 1g, an insulative material is deposited to an upper end of the gate or more on the resultant. At this time, the deposited insulative material preferably has a thickness of 1,000~10,000 Å. Then, an interlayer film 118 is formed by flattening the deposited insulation material to such an extent that the upper end of the gate is exposed. At this time, flattening of the insulative material is performed through a chemical mechanical polishing process.

Figure 1H:
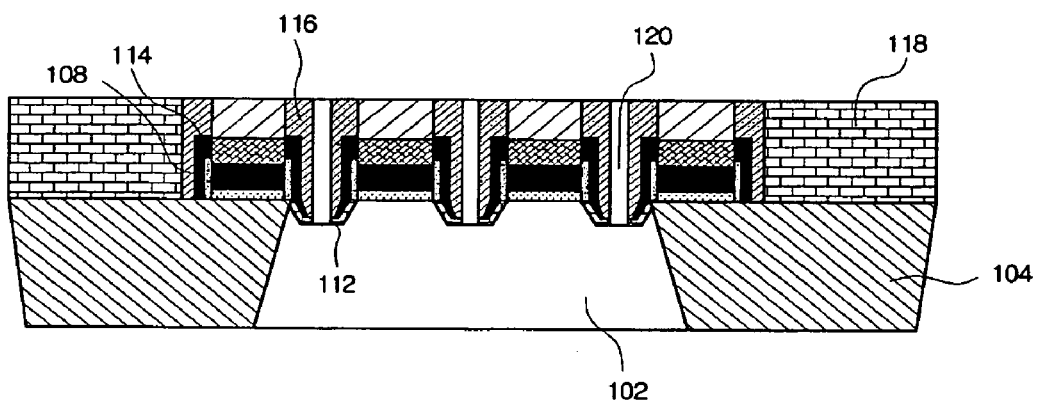

Then, as shown in FIG. 1h, the insulative material deposited between the gates 120 is removed to expose the silicon substrate 102 between the gates. At this time, the insulative material is removed to a depth of 500~1,000 Å with respect to a boundary surface of the silicon substrate 102 by dry etching. Then, ions are implanted to the exposed silicon substrate 102 to form a source and a drain.

Figure 1I:
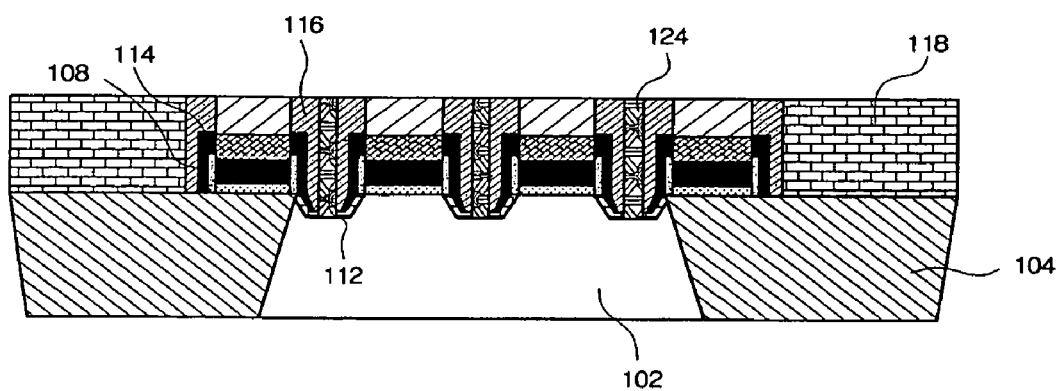

Finally, as shown in FIG. 1i, a poly-silicon is deposited to a height of the interlayer insulating film 118 or more on the exposed silicon substrate 102. Then, the deposited poly-silicon is flattened to be exposed. As a result, a plug 124 is formed between the gates.

In the method for forming the gate of the semiconductor device according to the embodiment, the gates are formed in a double layer, thereby increasing a length of the channel. As a result, the threshold voltage is increased, and an ion implantation amount is decreased, thereby enhancing the refresh property of the semiconductor device.

FIGS. 2a to 2d are flow diagrams illustrating a method for forming a gate structure of a semiconductor device in accordance with another embodiment of the present invention.

Figure 2A:
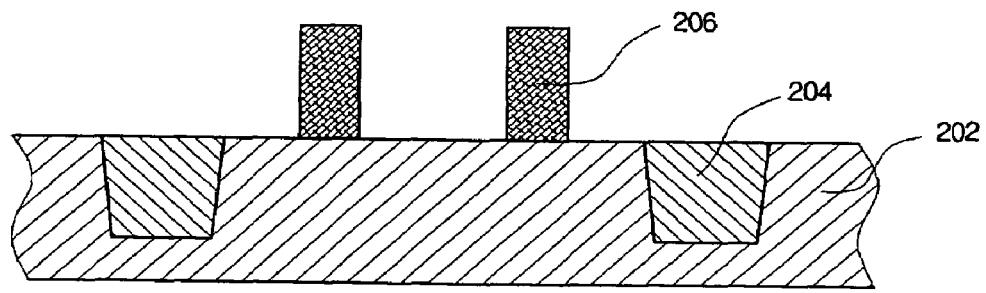
FIGS. 2a to 2d are flow diagrams illustrating a method for forming a gate structure of a semiconductor device in accordance with another embodiment of the present invention.

First, as shown in FIG. 2a, a field oxide film 204 is formed on a silicon substrate 202 to define an active region. Then, a photosensitive film pattern 206 for a gate pattern is formed on the active region of the silicon substrate. At this time, it is preferable that the width of the photosensitive film pattern 206 be smaller than that of the gate pattern to be formed.

Figure 2B:
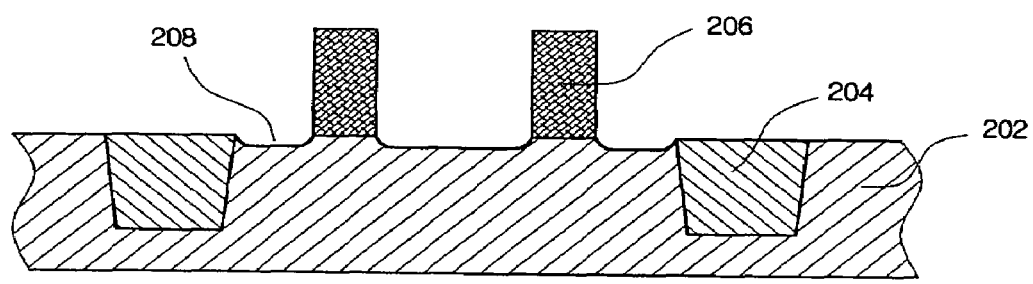

Then, as shown in FIG. 2b, an exposed region of the silicon substrate 202 is etched to a predetermined depth using the photosensitive film pattern 206 as a mask.

Figure 2C:
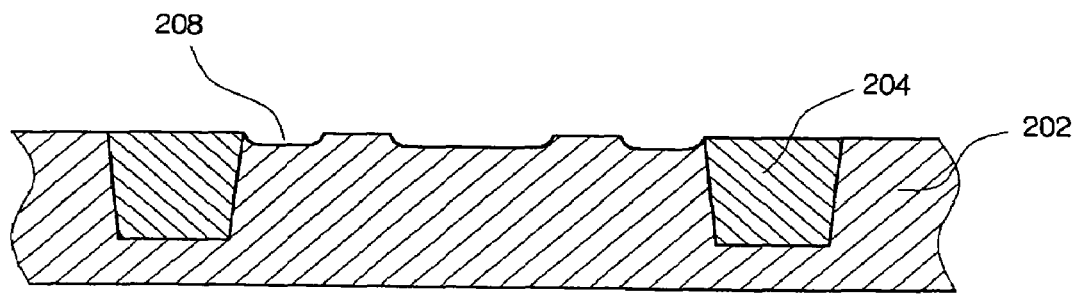

Next, as shown in FIG. 2c, the photosensitive film pattern 206 is stripped off.

Figure 2D:
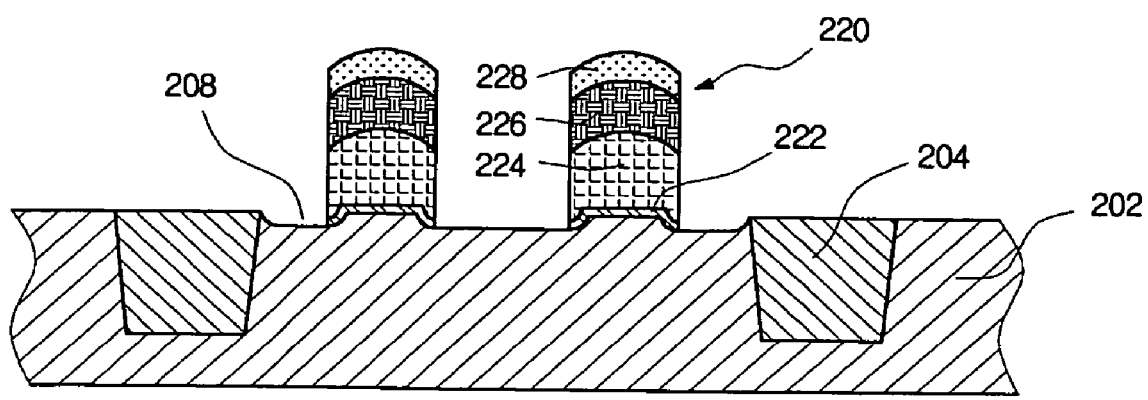

Finally, as shown in FIG. 2d, a gate oxide film, a gate conductive film, and a gate tungsten silicide film are sequentially formed over the entire surface of the silicon substrate from which the photosensitive film pattern 206 is removed. Then, a hard mask film 228 is formed on the tungsten silicide film to define a region to be formed with a gate. Etching is performed using the hard mask film 228 as the mask to form a gate pattern, which sequentially has a gate oxide film pattern 222, a gate conductive film pattern 226, and a gate tungsten silicide pattern 228.

At this time, the width of the gate pattern is larger than that of the photosensitive film pattern. That is, the gate oxide film pattern 222, the gate conductive film pattern 226, and the gate tungsten silicide pattern 228 constituting the gate pattern are formed on a predetermined region of a trench as well as a region of the silicon substrate from which the photosensitive film pattern 206 is removed, so that a channel formed below the gate pattern has an increased length.

In the method for forming the gate structure of the semiconductor device according to this embodiment as described above, the three-dimensional structure of the gate is changed to increase the channel length. As a result, the threshold voltage is increased, and an ion implantation amount is decreased, thereby enhancing the refresh property of the semiconductor device. Thus, it can be appreciated that the present invention is distinguished by the concept of a recess gate irrespective of some common features in structure between the gate of the present invention and the recess gate, and can solve the problems of the recess gate.

In addition, since such an effect of the invention is excellent in comparison to a step gate asymmetry recess cell (hereinafter, a "STAR cell") used for increasing the length of the channel for a highly integrated semiconductor device, the present invention increases the length of the channel more effectively than the STAR cell, and thus further decreases the ion implantation amount. Accordingly, a thick depletion layer can be formed, so that the refresh property is improved by 50~120 ms in comparison to the STAR cell. Furthermore, according to the invention, a surface path is enlarged, thereby improving the surface punch through breakdown voltage.

One of the advantageous effects of the invention is that the oxide film is formed in the double layer or the three dimensional structure of the gate is changed to increase the channel length, thereby increasing the threshold voltage.

In addition, the increased channel length allows a decrease of ion implantation amount, thereby improving the refresh property of the semiconductor device.

In particular, unlike a process for forming the recess gate, since a trench etching process is performed after formation of the gates, it is possible to avoid the problems of the recess gate beforehand, and to remove a photoresist process for forming the gate, decreasing manufacturing costs.

It should be understood that the embodiments and the accompanying drawings have been described for illustrative purposes and the present invention is limited only by the following claims. Further, those skilled in the art will appreciate that various modifications, additions and substitutions are allowed without departing from the scope and spirit of the invention as set forth in the accompanying claims.

What is claimed is:

1. A method for forming a gate structure of a semiconductor device, comprising:
    forming a plurality of gates including a first gate dielectric film, a first gate conductive film, and a gate silicide film sequentially stacked on a silicon substrate having a field oxide film;
    forming a thermal oxide film on a side of the first gate conductive film;
    etching the silicon substrate exposed between the plurality of gates to a predetermined depth to form a plurality of trenches;
    forming a second gate oxide film on an interior wall of the trenches; and
    forming a second gate conductive film of a spacer shape contacting a side of the gate silicide film and extending along the thermal oxide film and the second gate oxide film which is formed on the trenches.

2. The method according to claim 1, further comprising:
    forming a spacer nitride film on the side of each gate where the second gate conductive film is formed;
    forming a source and a drain by implanting ions to a region of the silicon substrate formed with the spacer nitride film and exposed between the gates; and
    forming a plug by burying an electrode material on the silicon substrate where the source and the drain are formed.

3. The method according to claim 1, wherein the thermal oxide film has a thickness of 20~200 Å.

4. The method according to claim 1, wherein the trenches have a depth of 200~2,000 Å.

5. The method according to claim 1, wherein the gate oxide film has a thickness of 30~300 Å.

6. The method according to claim 1, wherein the second gate conductive film is formed to an upper end of the gate silicide film.

7. The method according to claim 1, wherein the second gate conductive film has a thickness of 200~2,000 Å.

8. The method according to claim 1, wherein the spacer nitride film has a depth of 50~500 Å.

* * * * *